United States Patent
Hui et al.

(10) Patent No.: US 9,323,244 B2
(45) Date of Patent: Apr. 26, 2016

(54) SEMICONDUCTOR FABRICATION COMPONENT RETUNING

(71) Applicant: Taiwan Semiconductor Manufacturing Company Limited, Hsin-Chu (TW)

(72) Inventors: Keung Hui, Hsinchu (TW); Cheng Yen-Wei, Hsinchu (TW); Jong-I Mou, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 414 days.

(21) Appl. No.: 14/030,266

(22) Filed: Sep. 18, 2013

(65) Prior Publication Data

US 2015/0081081 A1 Mar. 19, 2015

(51) Int. Cl.
G05B 13/02 (2006.01)
G05B 17/02 (2006.01)
G05B 19/418 (2006.01)
H01L 21/66 (2006.01)

(52) U.S. Cl.
CPC ........ *G05B 19/41875* (2013.01); *G05B 13/024* (2013.01); *G05B 17/02* (2013.01); *G05B 2219/32135* (2013.01); *G05B 2219/45031* (2013.01); *H01L 22/12* (2013.01); *H01L 22/20* (2013.01); *Y02P 90/22* (2015.11); *Y02P 90/26* (2015.11)

(58) Field of Classification Search
USPC .......................................... 700/28, 108, 121
See application file for complete search history.

(56) References Cited

U.S. PATENT DOCUMENTS

| | | | | | |
|---|---|---|---|---|---|
| 7,809,459 | B2* | 10/2010 | Morisawa | ............ | G05B 13/041 700/109 |
| 8,108,060 | B2* | 1/2012 | Tsen | .................... | G05B 13/048 700/103 |
| 8,224,475 | B2* | 7/2012 | Tsai | .................... | G05B 13/024 700/108 |
| 8,229,588 | B2* | 7/2012 | Tsen | .................... | G05B 13/044 700/103 |
| 8,406,911 | B2* | 3/2013 | Limaye | ............ | G05B 19/41875 438/14 |
| 8,606,387 | B2* | 12/2013 | Tsai | ................. | G05B 19/41875 257/724 |
| 2014/0207271 | A1* | 7/2014 | Tsai | .................... | G05B 23/024 700/121 |

* cited by examiner

*Primary Examiner* — Carlos Ortiz Rodriguez
*Assistant Examiner* — Jennifer L Norton
(74) *Attorney, Agent, or Firm* — Cooper Legal Group, LLC (57) ABSTRACT

Among other things, one or more systems and techniques for retuning a semiconductor fabrication component are provided. The semiconductor fabrication component, such as an advanced process control (APC) component, is configured to evaluate or adjust various fabrication parameters associated with semiconductor fabrication processing. Processing data associated with the semiconductor fabrication component is evaluated to formulate performance indices used to evaluate performance of parameters used by the semiconductor fabrication component. One or more fabrication process change simulations are performed to generate a component operating behavior data structure indicating how different values for the parameters result in improved or degraded performance by the semiconductor fabrication component. In this way, the component operating behavior data structure is evaluated to identify tuning values for the parameters that are used to retune the semiconductor fabrication component.

20 Claims, 8 Drawing Sheets

SEMICONDUCTOR FABRICATION COMPONENT RETUNING

BACKGROUND

Various techniques, components, devices, etc. are applied to a semiconductor wafer during a semiconductor fabrication process. In an example, a lithography technique is used to transfer a pattern from a photomask to a photoresist on the semiconductor wafer. In another example, a material deposition component is used to deposit a material onto the semiconductor wafer. In another example, a wafer scrubber device is used to mitigate particle contamination on the semiconductor wafer by removing particles from a surface of the semiconductor wafer. A semiconductor fabrication component, such as an advanced process control (APC) component, is configured to evaluate the semiconductor fabrication process to determine whether fabrication parameters, such as process target parameters, are met. If a process target parameter is not met, such as a film thickness being outside an acceptable thickness range, then the semiconductor fabrication component generates an alert indicating that a fabrication process technician is to manually evaluate and adjust one or more fabrication techniques, components, devices, etc. so that the process target parameter is met. Statistical process control (SPC) charts are used to gauge whether the semiconductor fabrication component is operating correctly or adequately.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more systems and techniques for retuning one or more parameters of a semiconductor fabrication component, such as an advanced process control (APC) component, are provided herein. Performance capabilities of the APC component are evaluated by constructing performance indices from processing data associated with the APC component. One or more fabrication process change simulations are performed using the performance indices to generate a component operating behavior data structure, such as a curve or surface indicating performance results for the APC component when different values are used for parameters of the APC component. The component operating behavior data structure is evaluated to identify a tuning value for a parameter where the tuning value improves performance of the APC component. In this way, the APC component is retuned using the tuning value. In an embodiment, the APC component is retuned automatically without necessitating manual evaluation that would otherwise result in a significant investment of time for trial and error retuning of fabrication devices. In an embodiment, the APC component is retuned periodically according to a periodic retuning schedule.

Figure 1:
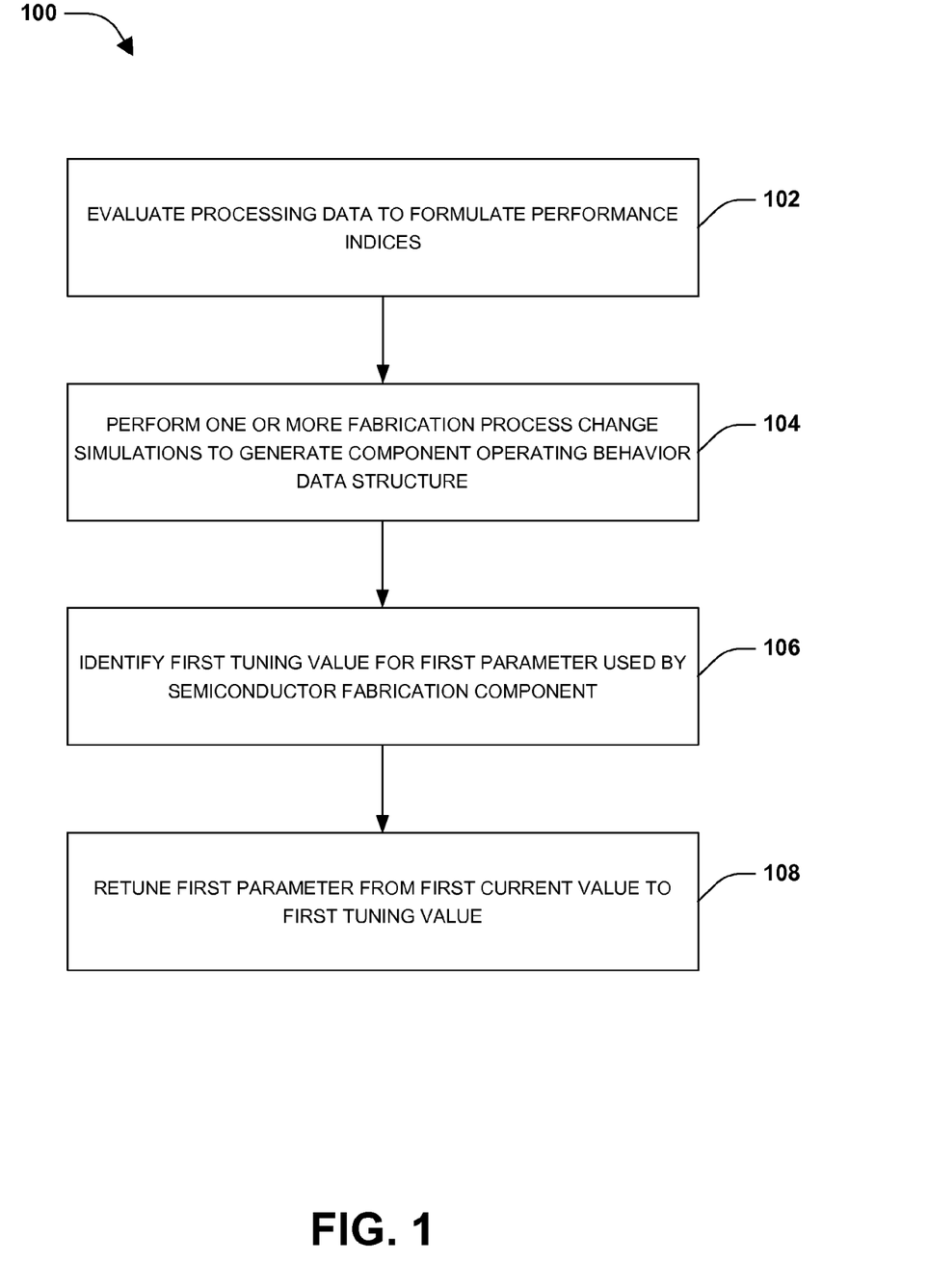
FIG. 1 is a flow diagram illustrating a method of retuning a parameter of a semiconductor fabrication component, according to some embodiments.

A method 100 of retuning a parameter of a semiconductor fabrication component is illustrated in FIG. 1. In an embodiment, the semiconductor fabrication component comprises an advanced process control (APC) component configured to evaluate semiconductor fabrication metrology and provide feedback, such as an alert that a fabrication parameter, such as a film thickness, a width, measurements or designs of semiconductor devices, or other process target parameters, is outside an acceptable target range or value. The APC component comprises a controller that utilizes one or more controller parameters, such as etching rates, polishing rates, or other parameters related to conditions of processing tools, to evaluate the semiconductor fabrication metrology. The APC component comprises a filter that utilizes one or more filter parameters, such as weights used in accessing incoming metrology measures of processing conditions, to evaluate the semiconductor fabrication metrology. As provided herein, one or more parameters used by the APC component are automatically retuned, such as according to a periodic retuning schedule, so that the APC component is effectively evaluating or adjusting the semiconductor fabrication process for improved semiconductor fabrication metrology or results.

At 102, processing data associated with a semiconductor fabrication component is evaluated to formulate performance indices. In an embodiment, the processing data comprises upstream tool outputs, control inputs, process outputs, tool settings, controller settings, process targets such as fabrication parameters, parameters employed by the semiconductor fabrication component, or other information associated with the semiconductor fabrication process. The performance indices are used to evaluate performance of the semiconductor fabrication component, such as how a controller parameter or a filter parameter is performing or behaving during operation of the semiconductor fabrication component. In an embodiment, the performance indices correspond to performance characteristics of the semiconductor fabrication component with respect to control of one or more fabrication parameters, such as temperature, etching rates, time constraints, trimming rates, etc.

At 104, one or more fabrication process change simulations are performed based upon the performance indices to generate a component operating behavior data structure. It is appreciated that any number, such as thousands or millions, of simulations are performed to generate the component operating behavior data structure. In an embodiment, an initial fabrication process simulation is performed using a first current value for a first parameter of the semiconductor fabrication component, such as a value of a controller parameter or a filter parameter currently used by the APC component to evaluate or control the semiconductor fabrication process. A result of the initial fabrication process simulation is used as a current performance value for the semiconductor fabrication component, and is represented within the component operating behavior data structure (e.g., FIG. 3B). A first fabrication process change simulation uses a new first current value for the first parameter, and a result of the first fabrication process change simulation is represented within the component operating behavior data structure (e.g., FIG. 3B). In this way, different values for the first parameter are simulated during the one or more fabrication process change simulations to generate the component operating behavior data structure. In an embodiment, the component operating behavior data structure comprises a characteristic curve for the first parameter where a single parameter is used by the semiconductor fabrication component. In an embodiment, the component operating behavior data structure comprises a characteristic surface for the first parameter and one or more additional parameters where multiple parameters are used by the semiconductor fabrication component.

At 106, a first tuning value is identified for the first parameter based upon the component operating behavior data structure indicating that the first tuning value retunes, such as improves efficiency or performance of the semiconductor fabrication component, the semiconductor fabrication component with respect to a first current value for the first parameter. In an embodiment, the first tuning value is identified based upon the first tuning value reducing a performance cost identified within a parameter space represented within the component operating behavior data structure. In an embodiment, the first tuning value is identified based upon the first tuning value satisfying an objective performance function for the semiconductor fabrication component, such as improving accuracy or efficiency of the semiconductor fabrication component. In an embodiment, performance metrology associated with the semiconductor fabrication process is efficiently improved based upon retuning the first parameter from the first current value to the first tuning value. At 108, the first parameter is retuned from the first current value to the first tuning value. The first parameter is retuned to improve efficiency of the semiconductor fabrication component for evaluating or controlling the semiconductor fabrication process. In an embodiment, multiple parameters are retuned, such as a second parameter retuned with a second tuning value. In an embodiment, multiple parameters are retuned in parallel. In an embodiment, parameters are sequentially retuned.

Figure 2:
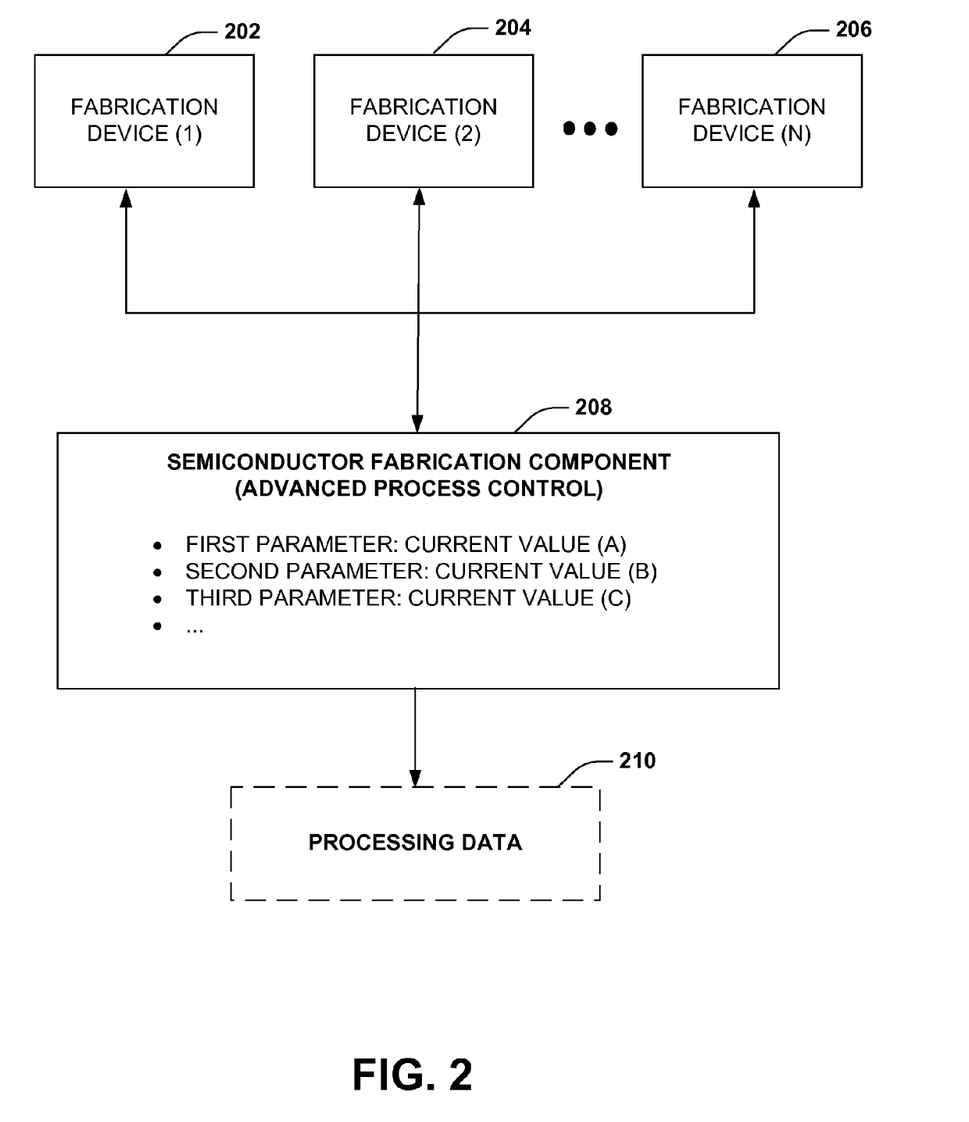
FIG. 2 is an illustration of a semiconductor fabrication component, according to some embodiments.

FIG. 2 illustrates an embodiment of a semiconductor fabrication component 208. In an embodiment, the semiconductor fabrication component 208 comprises an advanced process control (APC) component. The APC component is configured to adjust fabrication parameters, such as thicknesses, widths, measurements or designs of semiconductor devices, or other process target parameters, used in recipes of processing tools, such as fabrication device (1) 202, fabrication device (2) 204, or other fabrication devices such as fabrication device (N) 206. In an embodiment, fabrication devices or tools comprise semiconductor fabrication techniques, components, etc. The APC component comprises a controller component that operates based upon controller parameters, such as etching rates, polishing rates, or other parameters related to current conditions of processing tools. The APC component comprises a filter component that operates based upon filter parameters, such as weightings used in assessing metrology measurements of process conditions. In an embodiment, the semiconductor fabrication component 208 evaluates or adjusts fabrication parameters, such as process target parameters associated with the processing tools, based upon a first parameter having a current value (A), a second parameter having a current value (B), a third parameter having a current value (C), etc. Processing data 210 is collected from the semiconductor fabrication process, such as metrology data, and is collected from the semiconductor fabrication component 208 such as parameters and current values of parameters used by the semiconductor fabrication component 208.

Figure 3A:
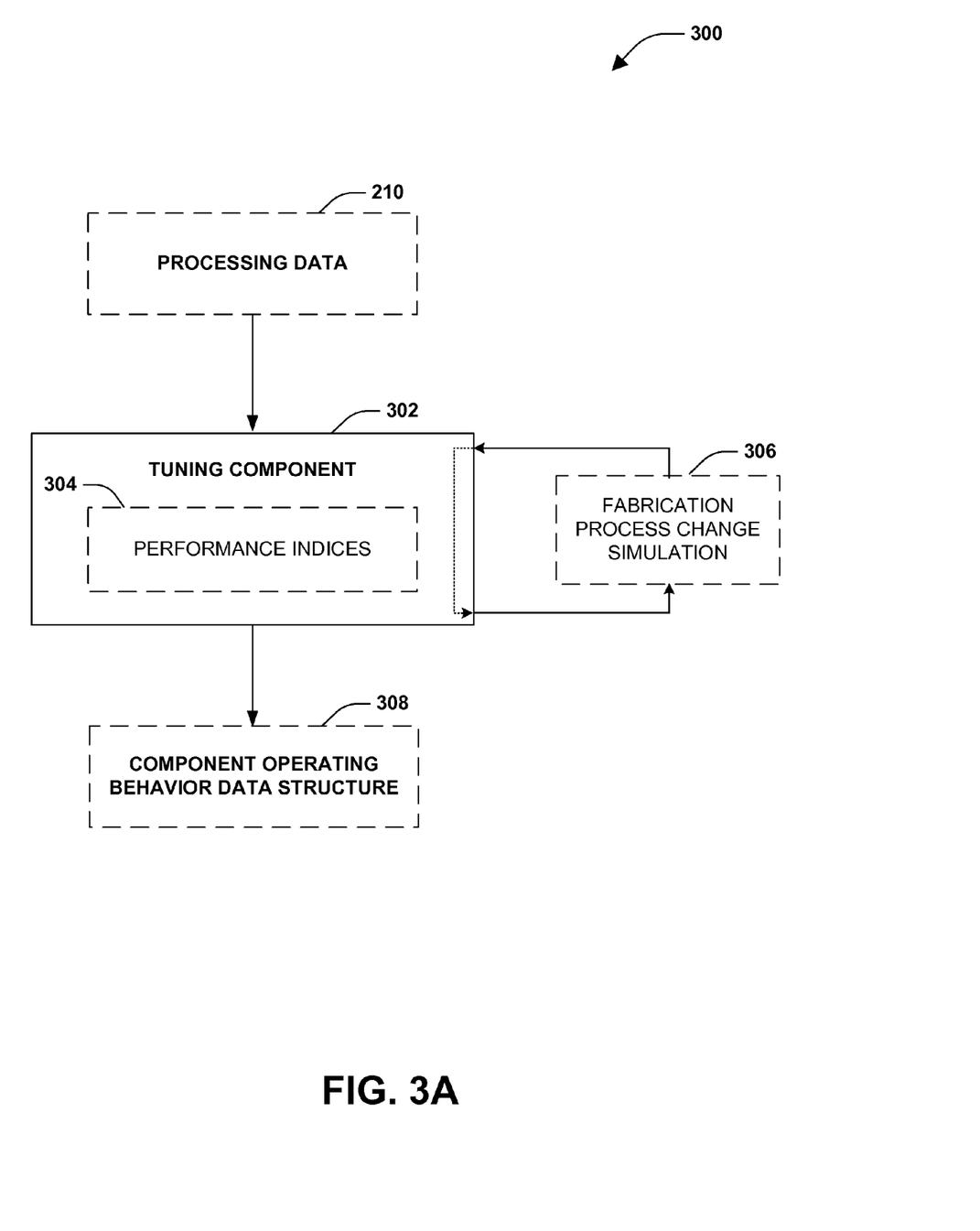
FIG. 3A is an illustration of a system for generating a component operating behavior data structure, according to some embodiments.

FIG. 3A illustrates a system 300 for generating a component operating behavior data structure 308. The system 300 comprises a tuning component 302. The tuning component 302 is configured to evaluate processing data 210 associated with a semiconductor fabrication component 208 to formulate performance indices 304. In an embodiment, the processing data 210 comprises upstream tool outputs, control inputs, process outputs, tool settings, controller settings, fabrication parameters such as process target parameters, or a set of parameters employed by the semiconductor fabrication component. The performance indices 304 are used to evaluate or judge how efficient or effective current values for parameters used by the semiconductor fabrication component 208 perform with regard to the semiconductor fabrication component 208 evaluating or adjusting process target parameters, such as thickness, widths, or other measurements or designs of semiconductor devices. That is, the performance indices 304 correspond to performance characteristics of the semiconductor fabrication component 208 with respect to control of fabrication parameters such as process target parameters.

The tuning component 302 is configured to perform one or more fabrication process change simulations 306 based upon the performance indices 304 to generate the component operating behavior data structure 308. In an embodiment, a plurality of fabrication process change simulations 306 are performed where different values are used for one or more parameters during respective fabrication process change simulations, such as a current value (A) for the first parameter during an initial fabrication probes simulation as a baseline indicator of how the semiconductor fabrication component 208 is currently operating, a first new value for the first parameter during a first fabrication process change simulation, a second new value for the first parameter during a second fabrication process change simulation, etc. In this way, the component operating behavior data structure 308 indicates how effective different values are for parameters used by the semiconductor fabrication component 208.

In an embodiment where the fabrication process change simulations are computationally intensive, the tuning component 302 is implemented across a plurality of computing devices. The tuning component 302 is configured to facilitate data exchanges between various computing platforms of the computing devices. In an embodiment, the tuning component 302 retunes parameters, such as individual controller parameters or filter parameters, sequentially. In an embodiment, the tuning component 302 retunes parameters, such as multiple controller parameters or filter parameters, in parallel.

Figure 3B:
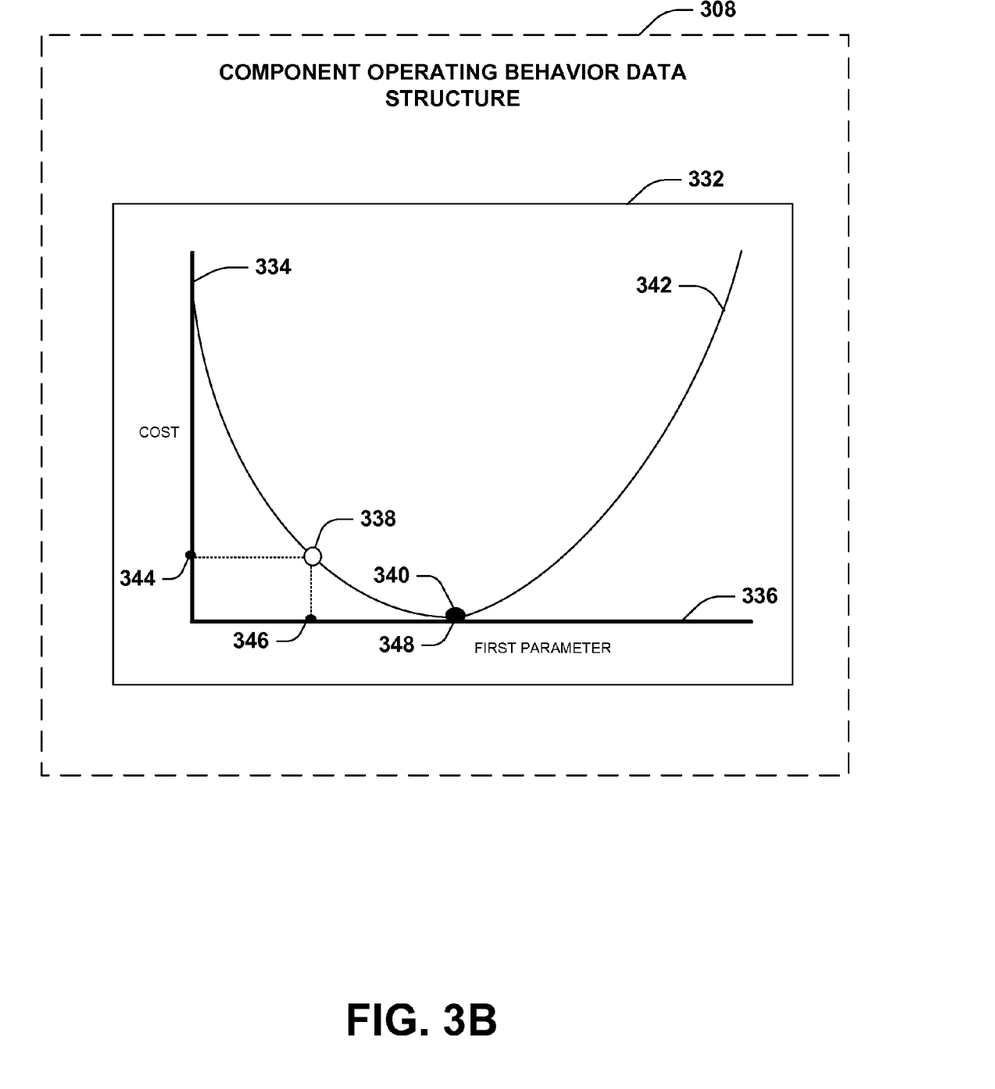
FIG. 3B is an illustration of a component operating behavior data structure, according to some embodiments.

FIG. 3B illustrates an embodiment of the component operating behavior data structure 308. In an embodiment, the component operating behavior data structure 308 comprises a characteristics curve 332. The characteristics curve 332 comprises a curve 342 comprising points that correlate values for a first parameter, represented along a first parameter axis 336, to costs associated with using such values, represented along a cost axis 334. A current point 338 correlates a current cost 344 to a current value 346 for the first parameter. The current cost 344 is indicative of a current performance of the semiconductor fabrication component 208 using the current value 346 for the first parameter. A retuning point 340 correlates a retuning cost, such as a minimized, desired, or optimal cost, to a tuning value 348. The tuning value 348 corresponds to an improved performance for the semiconductor fabrication component 208, where the tuning value 348 is used for the first parameter instead of using the current value 346 for the first parameter. In this way, the first parameter used by the semiconductor fabrication component 208 is retuned from the current value 346 to the tuning value 348 for improved performance of the semiconductor fabrication component 208.

Figure 3C:
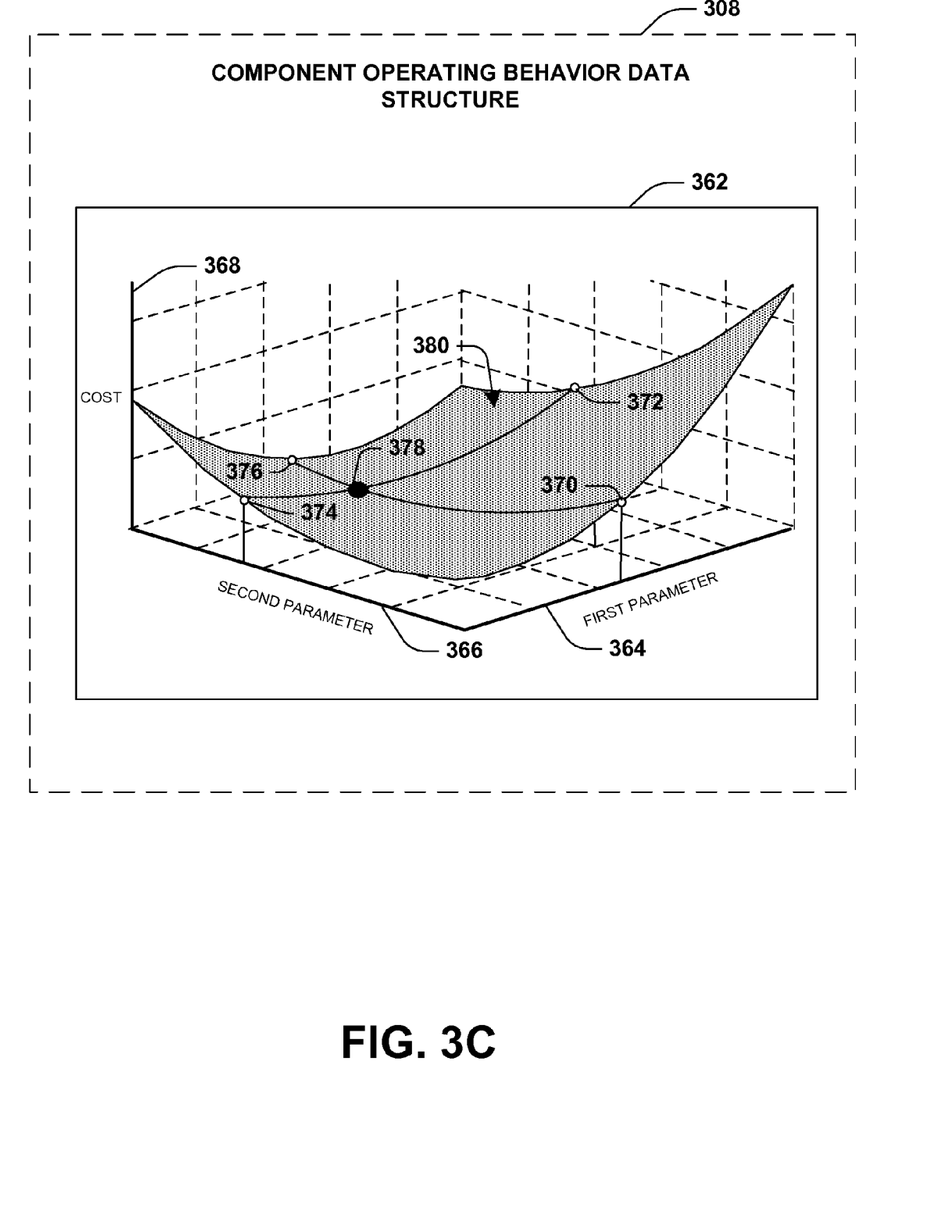
FIG. 3C is an illustration of a component operating behavior data structure, according to some embodiments.

FIG. 3C illustrates an embodiment of the component operating behavior data structure 308. In an embodiment, the component operating behavior data structure 308 comprises a characteristic surface 362. The characteristics surface 362 comprises a surface 380 comprising points that correlate values for a tuning parameter pairing to costs associated with using such values. The costs are represented along a cost axis 368. The tuning parameter pairing comprises a first parameter, represented along a first parameter axis 364, and a second parameter, represented along a second parameter axis 366. A first point 370 correlates a first cost to a first value for the first parameter and a second value for the second parameter. A second point 372 correlates a second cost to a third value for the first parameter and a fourth value for the second parameter. A third point 374 correlates a third cost to a fifth value for the first parameter and a sixth value for the second parameter. A fourth point 376 correlates a fourth cost to a seventh value for the first parameter and an eighth value for the second parameter. A retuning point 378 correlates a retuning cost, such as a minimized cost, to a tuning parameter pairing value corresponding to a first tuning value for the first parameter and a second tuning value for the second parameter. In an embodiment, the first tuning value and the second tuning value of the retuning point 378 minimize an objective function such that the retuning point 378 corresponds to a reduced performance cost identified within a parameter space represented within the characteristic surface 362. In this way, the first parameter and the second parameter used by the semiconductor fabrication component 208 are retuned from a current pairing value to the tuning parameter pairing value, represented by the retuning point 378, for improved performance of the semiconductor fabrication component 208.

Figure 4:
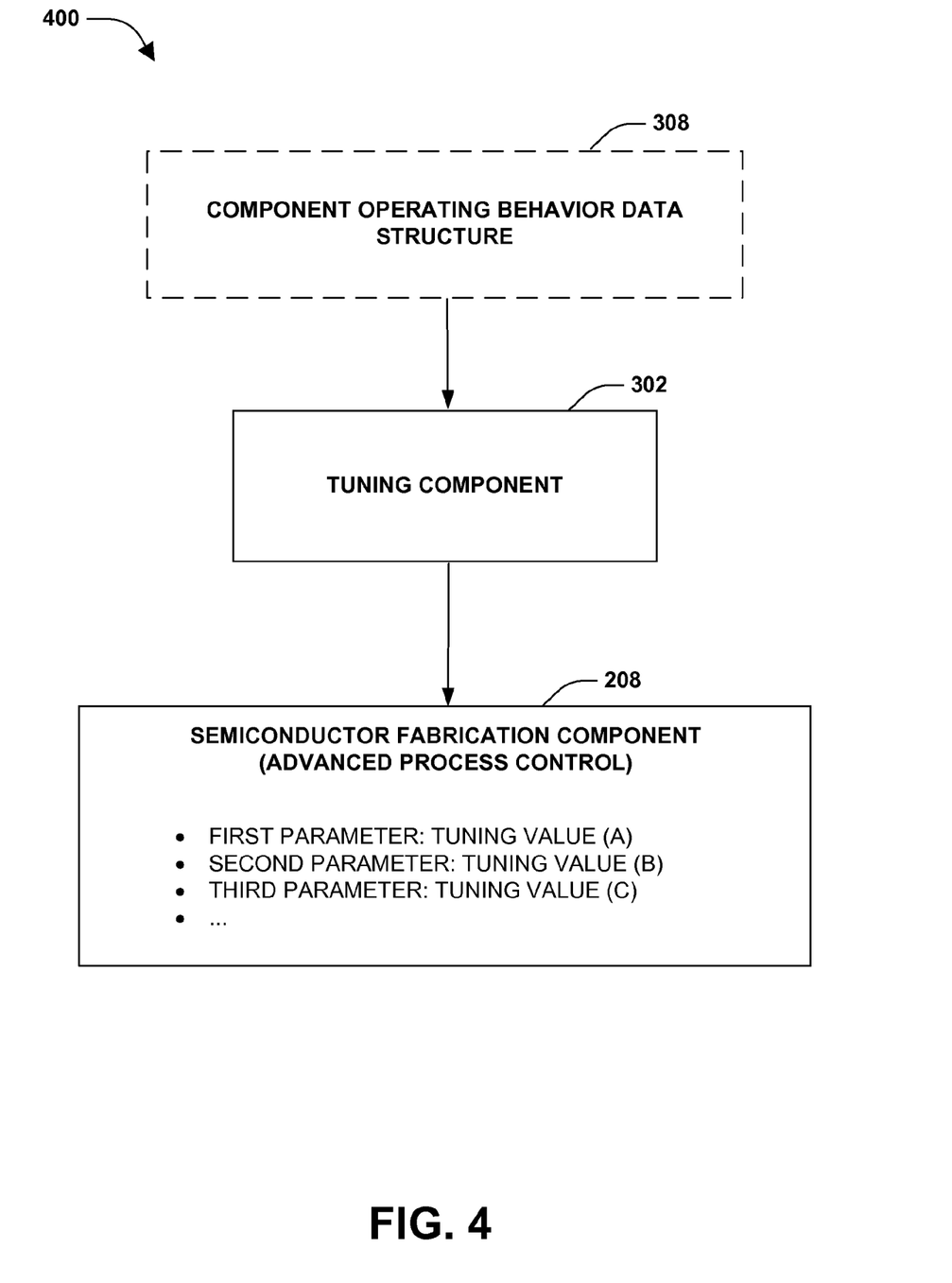
FIG. 4 is an illustration of a system for retuning a parameter of a semiconductor fabrication component, according to some embodiments.

FIG. 4 illustrates an embodiment of a system 400 for retuning a parameter of a semiconductor fabrication component 208. The system 400 comprises a tuning component 302. In an embodiment, the tuning component 302 generated the component operating behavior data structure 308 based upon processing data 210, as illustrated in FIG. 3A. The tuning component 302 is configured to retune one or more parameters used by the semiconductor fabrication component 208. In an embodiment, the first parameter is retuned from the current value (A) to a tuning value (A), the second parameter is retuned from the current value (B) to a tuning value (B), the third parameter is retuned from the current value (C) to a tuning value (C), etc. In an embodiment, parameters used by the semiconductor fabrication component 208 are automatically retuned with little to no manual evaluation or adjustment. In an embodiment, the parameters are retuned according to a periodic retuning schedule for the semiconductor fabrication component 208. In this way, the tuning component 302 automatically tunes the semiconductor fabrication component 208 for efficient performance in evaluating or adjusting semiconductor fabrication processing.

Figure 5:
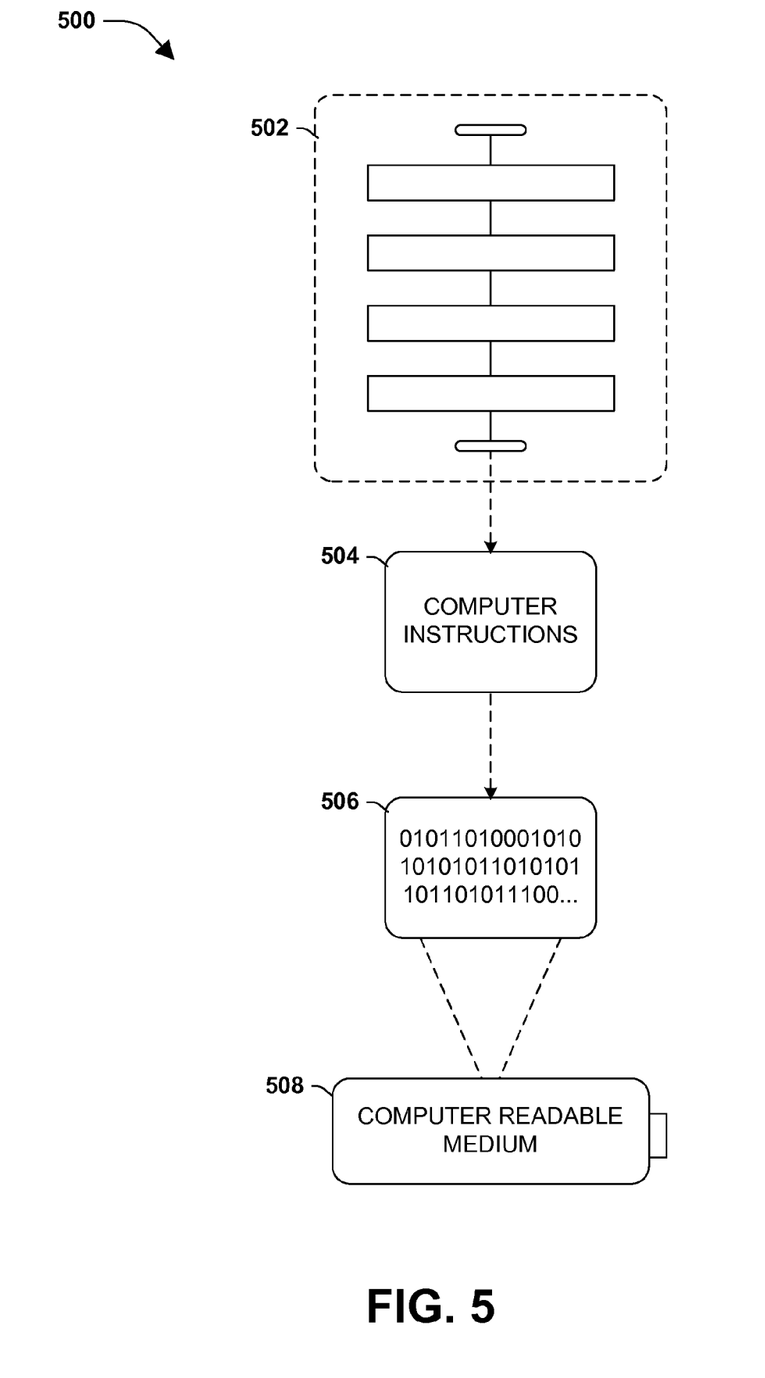
FIG. 5 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium is illustrated in FIG. 5, wherein the implementation 500 comprises a computer-readable medium 508 (e.g., a CD-R, DVD-R, flash drive, a platter of a hard disk drive, etc.), on which is encoded computer-readable data 506. This computer-readable data 506 in turn comprises a set of computer instructions 504 configured to operate according to one or more of the principles set forth herein. In one such embodiment 500, the processor-executable computer instructions 504 may be configured to perform a method 502, such as at least some of the exemplary method 100 of FIG. 1, for example. In another such embodiment, the processor-executable instructions 512 may be configured to implement a system, such as at least some of the exemplary system 300 of FIG. 3A and/or at least some of the exemplary system 400 of FIG. 4, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 6:
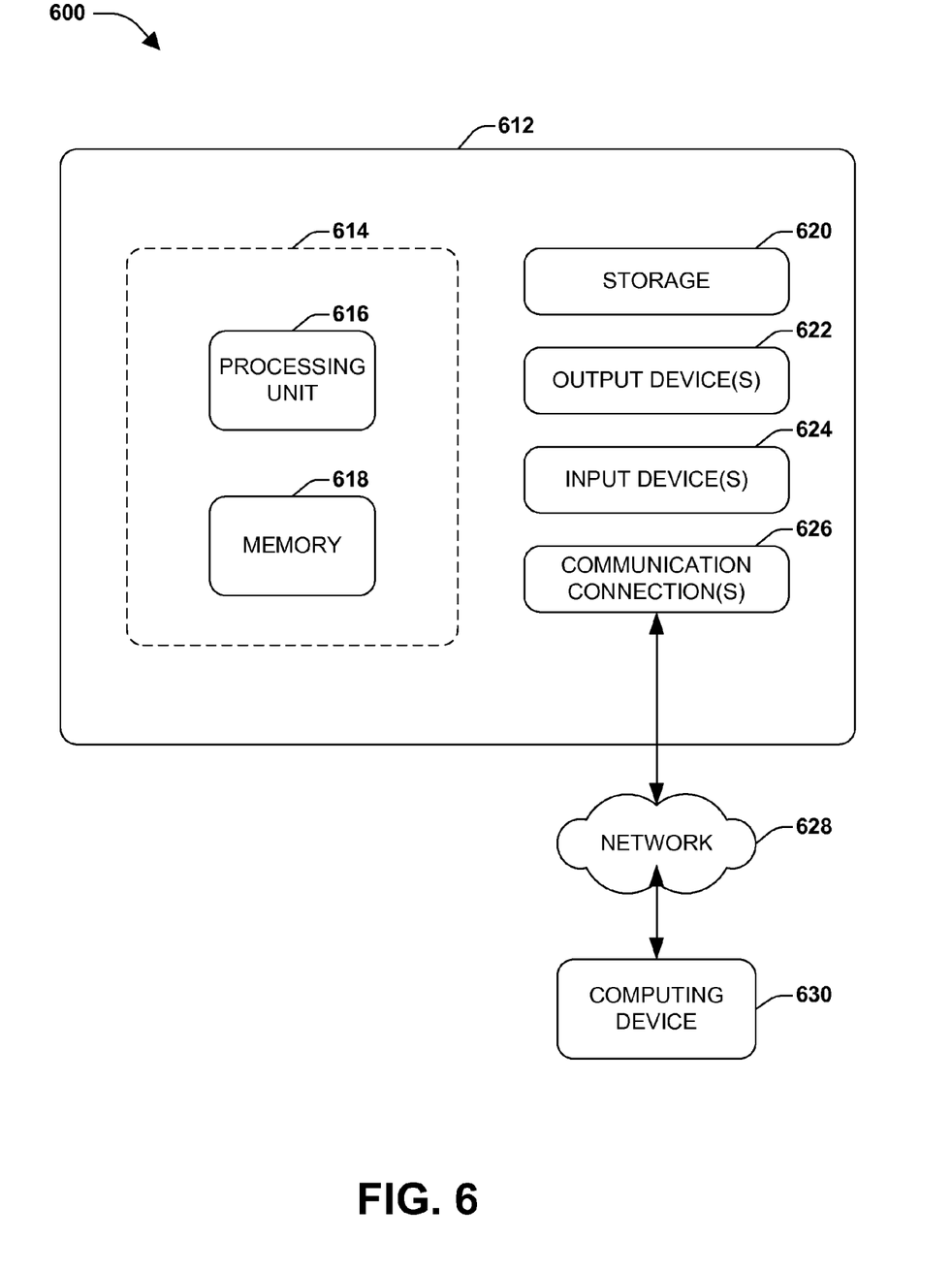
FIG. 6 illustrates an example computing environment wherein one or more of the provisions set forth herein may be implemented.

FIG. 6 and the following discussion provide a brief, general description of a suitable computing environment to implement embodiments of one or more of the provisions set forth herein. The operating environment of FIG. 6 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 6 illustrates an example of a system 600 comprising a computing device 612 configured to implement one or more embodiments provided herein. In one configuration, computing device 612 includes at least one processing unit 616 and memory 618. Depending on the exact configuration and type of computing device, memory 618 may be volatile (such as RAM, for example), non-volatile (such as ROM, flash memory, etc., for example) or some combination of the two. This configuration is illustrated in FIG. 6 by dashed line 614.

In other embodiments, device 612 may include additional features and/or functionality. For example, device 612 may also include additional storage (e.g., removable and/or non-removable) including, but not limited to, magnetic storage, optical storage, and the like. Such additional storage is illustrated in FIG. 6 by storage 620. In some embodiments, computer readable instructions to implement one or more embodiments provided herein may be in storage 620. Storage 620 may also store other computer readable instructions to implement an operating system, an application program, and the like. Computer readable instructions may be loaded in memory 618 for execution by processing unit 616, for example.

The term "computer readable media" as used herein includes computer storage media. Computer storage media includes volatile and nonvolatile, removable and non-removable media implemented in any method or technology for storage of information such as computer readable instructions or other data. Memory 618 and storage 620 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 612. Any such computer storage media may be part of device 612.

Device 612 may also include communication connection(s) 626 that allows device 612 to communicate with other devices. Communication connection(s) 626 may include, but is not limited to, a modem, a Network Interface Card (NIC), an integrated network interface, a radio frequency transmitter/receiver, an infrared port, a USB connection, or other interfaces for connecting computing device 612 to other computing devices. Communication connection(s) 626 may include a wired connection or a wireless connection. Communication connection(s) 626 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 612 may include input device(s) 624 such as keyboard, mouse, pen, voice input device, touch input device, infrared cameras, video input devices, and/or any other input device. Output device(s) 622 such as one or more displays, speakers, printers, and/or any other output device may also be included in device 612. Input device(s) 624 and output device(s) 622 may be connected to device 612 via a wired connection, wireless connection, or any combination thereof. In some embodiments, an input device or an output device from another computing device may be used as input device(s) 624 or output device(s) 622 for computing device 612.

Components of computing device 612 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 612 may be interconnected by a network. For example, memory 618 may be comprised of multiple physical memory units located in different physical locations interconnected by a network.

Those skilled in the art will realize that storage devices utilized to store computer readable instructions may be distributed across a network. For example, a computing device 630 accessible via a network 628 may store computer readable instructions to implement one or more embodiments provided herein. Computing device 612 may access computing device 630 and download a part or all of the computer readable instructions for execution. Alternatively, computing device 612 may download pieces of the computer readable instructions, as needed, or some instructions may be executed at computing device 612 and some at computing device 630.

According to an aspect of the instant disclosure, a method for retuning a parameter of a semiconductor fabrication component is provided. The method comprises evaluating processing data associated with a semiconductor fabrication component to formulate performance indices. One or more fabrication process change simulations are performed based upon the performance indices to generate a component operating behavior data structure. A first tuning value is identified for a first parameter used by the semiconductor fabrication component based upon the component operating behavior data structure indicating that the first tuning value retunes the semiconductor fabrication component with respect to a current value for the first parameter specified within the processing data. The first parameter is retuned from the first current value to the first tuning value.

According to an aspect of the instant disclosure, a system for retuning a parameter of a semiconductor fabrication component is provided. The system comprises a tuning component. The tuning component is configured to evaluate processing data associated with a semiconductor fabrication component to formulate performance indices. The tuning component is configured to perform one or more fabrication process change simulations based upon the performance indices to generate a component operating behavior data structure. The tuning component is configured to identify a first tuning value for a first parameter used by the semiconductor fabrication component based upon the component operating behavior data structure indicating that the first tuning value satisfies an objective performance function of the semiconductor fabrication component. The retuning component retunes the first parameter from a first current value for the first parameter to the first tuning value.

According to an aspect of the instant disclosure, a computer readable medium comprising instructions which when executed at least in part via a processing unit perform a method for retuning a semiconductor fabrication component is provided. The method comprises evaluating processing data associated with a semiconductor fabrication component to formulate performance indices. One or more fabrication process change simulations are performed based upon the performance indices to generate a component operating behavior data structure. A tuning parameter pairing used by the semiconductor fabrication component is identified. The tuning parameter pairing comprises a first parameter and a second parameter. A tuning parameter pairing value is identified for the tuning parameter paring based upon the component operating behavior data structure indicating that the tuning parameter pairing value satisfies an object performance function for the semiconductor fabrication component. The semiconductor fabrication component is retuned based upon the tuning parameter pairing value.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for retuning a parameter of a semiconductor fabrication component, comprising:
   evaluating processing data associated with a semiconductor fabrication component to formulate performance indices;
   performing one or more fabrication process change simulations based upon the performance indices to generate a component operating behavior data structure;
   identifying a first tuning value for a first parameter used by the semiconductor fabrication component based upon the component operating behavior data structure indicating the first tuning value retunes the semiconductor fabrication component with respect to a first current value for the first parameter specified within the processing data;
   identifying a second tuning value for a second parameter used by the semiconductor fabrication component based upon the component operating behavior data structure indicating the second tuning value retunes the semiconductor fabrication component with respect to a second current value for the second parameter specified within the processing data; and
   retuning the first parameter from the first current value to the first tuning value and the second parameter from the second current value to the second tuning value, wherein:
      the component operating behavior data structure comprises a characteristic surface for the first parameter and the second parameter; and
      the characteristic surface comprises a surface comprising a retuning point that correlates a selected retuning cost to a tuning parameter pairing value corresponding to the first tuning value for the first parameter and the second tuning value for the second parameter, the first tuning value and the second tuning value selected based upon the tuning parameter pairing value being correlated to the selected retuning cost.

2. The method of claim 1, the semiconductor fabrication component comprising an advanced process control (APC) component.

3. The method of claim 1, the first parameter corresponding to a controller parameter.

4. The method of claim 1, the first parameter corresponding to a filter parameter.

5. The method of claim 1, the component operating behavior data structure derived from a characteristic curve for the first parameter.

6. The method of claim 1, the performance indices corresponding to performance characteristics of the semiconductor fabrication component with respect to control of one or more fabrication parameters.

7. The method of claim 1, the retuning comprising:
   automatically retuning the first parameter.

8. The method of claim 1, comprising:
   implementing a periodic retuning schedule for the semiconductor fabrication component.

9. The method of claim 1, the retuning comprising:
   retuning the second parameter in parallel with retuning the first parameter.

10. The method of claim 1, the retuning comprising:
    sequentially retuning the first parameter and then the second parameter.

11. The method of claim 1, the processing data comprising at least one of an upstream tool output, a control input, a process output, a tool setting, a controller setting, a process target, or a set of parameters employed by the semiconductor fabrication component.

12. The method of claim 1, the performing one or more fabrication process change simulations comprising at least one of:
performing an initial fabrication process simulation using the first current value for the first parameter; or
performing a fabrication process change simulation using a new first current value for the first parameter.

13. A system for retuning a parameter of a semiconductor fabrication component, comprising:
a processing unit; and
a non-transitory memory comprising instructions that when executed by the processing unit cause a tuning component:
evaluate processing data associated with a semiconductor fabrication component to formulate performance indices;
perform one or more fabrication process change simulations based upon the performance indices to generate a component operating behavior data structure;
identify a first tuning value for a first parameter used by the semiconductor fabrication component based upon the component operating behavior data structure indicating the first tuning value satisfies an objective performance function for the semiconductor fabrication component;
identify a second tuning value for a second parameter used by the semiconductor fabrication component based upon the component operating behavior data structure indicating the second tuning value satisfies the objective performance function for the semiconductor fabrication component; and
retune the first parameter from a first current value for the first parameter to the first tuning value and the second parameter from a second current value to the second tuning value, wherein:
the component operating behavior data structure comprises a characteristic surface for the first parameter and the second parameter; and
the characteristic surface comprises a surface comprising a retuning point that correlates a selected retuning cost to a tuning parameter pairing value corresponding to the first tuning value for the first parameter and the second tuning value for the second parameter, the selected retuning cost describing the objective performance function.

14. The system of claim 13, the tuning component implemented across a plurality of computing devices.

15. The system of claim 13, the component operating behavior data structure derived from a characteristic curve for the first parameter.

16. A non-transitory computer readable medium comprising instructions which when executed at least in part via a processing unit perform a method for retuning a semiconductor fabrication component, comprising:
evaluating processing data associated with a semiconductor fabrication component to formulate performance indices;
performing one or more fabrication process change simulations based upon the performance indices to generate a component operating behavior data structure;
identifying a tuning parameter pairing used by the semiconductor fabrication component, the tuning parameter pairing comprising a first parameter and a second parameter;
identifying a tuning parameter pairing value for the tuning parameter pairing based upon the component operating behavior data structure indicating the tuning parameter pairing value satisfies an objective performance function for the semiconductor fabrication component; and
retuning the semiconductor fabrication component based upon the tuning parameter pairing value, wherein:
the component operating behavior data structure comprises a characteristic surface for the first parameter and the second parameter; and
the characteristic surface comprises a surface comprising a retuning point that correlates a selected retuning cost to the tuning parameter pairing value, the tuning parameter pairing value corresponding to a first tuning value for the first parameter and a second tuning value for the second parameter, the selected retuning cost describing the objective performance function.

17. The non-transitory computer readable medium of claim 16, the performing one or more fabrication process change simulations comprising:
performing an initial fabrication process simulation using a first value for the first parameter; and
performing a fabrication process change simulation using a second value for the first parameter.

18. The non-transitory computer readable medium of claim 16, the component operating behavior data structure derived from a first characteristic curve for the first parameter.

19. The non-transitory computer readable medium of claim 18, the component operating behavior data structure derived from a second characteristic curve for the second parameter.

20. The non-transitory computer readable medium of claim 18, the semiconductor fabrication component comprising an advanced process control (APC) component.

* * * * *